(12) United States Patent
Yi

(10) Patent No.: US 9,490,301 B2
(45) Date of Patent: Nov. 8, 2016

(54) OLED STRUCTURE AND MANUFACTURING METHOD THEREOF

(71) Applicant: Shenzhen China Star Optoelectronics Technology Co., Ltd., Shenzhen, Guangdong (CN)

(72) Inventor: Zhigen Yi, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 196 days.

(21) Appl. No.: 14/384,471

(22) PCT Filed: Jul. 14, 2014

(86) PCT No.: PCT/CN2014/082128
§ 371 (c)(1),
(2) Date: Sep. 11, 2014

(87) PCT Pub. No.: WO2015/196517
PCT Pub. Date: Dec. 30, 2015

(65) Prior Publication Data
US 2016/0240588 A1   Aug. 18, 2016

(30) Foreign Application Priority Data
Jun. 23, 2014 (CN) .......................... 2014 1 0284265

(51) Int. Cl.
H01L 33/00 (2010.01)
H01L 21/66 (2006.01)
H01L 27/32 (2006.01)
H01L 51/50 (2006.01)
H01L 51/56 (2006.01)

(52) U.S. Cl.
CPC ........... *H01L 27/3213* (2013.01); *H01L 27/32* (2013.01); *H01L 27/322* (2013.01); *H01L 51/50* (2013.01); *H01L 51/5036* (2013.01); *H01L 51/56* (2013.01)

(58) Field of Classification Search
CPC .................................................. H01L 27/3213
USPC .................................. 438/29–31; 257/95, 98
See application file for complete search history.

(56) References Cited

U.S. PATENT DOCUMENTS

| | | | | |
|---|---|---|---|---|
| 7,903,055 B2 * | 3/2011 | Nishikawa | .......... | H01L 51/5209 345/77 |
| 9,209,231 B2 * | 12/2015 | Song | ...................... | H01L 27/322 257/40 |
| 9,252,194 B2 * | 2/2016 | Ochi | ................... | H01L 51/5281 |
| 9,287,526 B2 * | 3/2016 | Miyazawa | .......... | H01L 51/5271 257/E51.021 |

FOREIGN PATENT DOCUMENTS

CN        1947464 A      4/2007

* cited by examiner

*Primary Examiner* — Calvin Lee
(74) *Attorney, Agent, or Firm* — Andrew C. Cheng

(57) ABSTRACT

Disclosed are an OLED structure and a manufacture method thereof. The OLED structure includes: a substrate, an over coat layer on the substrate and a micro-cavity on the over coat layer; an upper surface of the over coat layer away from the substrate appears a wavy fluctuation having raised peaks and depressed troughs smoothly joined with the raised peaks, and the micro-cavity appears a wavy fluctuation in accordance with the upper surface of the over coat layer to eliminate directionality issues of luminous intensity and color for realizing wide view angle display.

7 Claims, 8 Drawing Sheets

OLED STRUCTURE AND MANUFACTURING METHOD THEREOF

FIELD OF THE INVENTION

The present invention relates to a display skill field, and more particularly to a full color OLED structure and a manufacture method thereof.

BACKGROUND OF THE INVENTION

In a display skill field, a flat panel display possesses advantages of being ultra thin, power saved and radiation free. It has been widely utilized. A present flat panel display, such as a LCD (Liquid Crystal Display) or an OLED (Organic Light Emitting Display) has been gradually replacing the CRT displays. The OLED possesses many outstanding properties of self-illumination, low driving voltage, high luminescence efficiency, fast response, high clarity and contrast, near 180° view angle, wide range of working temperature, applicability of flexible display and large scale full color display. The OLED is considered as most potential flat panel display technology.

Generally, OLED comprises a substrate, ITO transparent anode located on the substrate, a Hole Injection Layer (HIL) located on the ITO transparent anode, a Hole Transporting Layer located on the Hole Injection Layer, an Emitting Material Layer (EML) located on the Hole Transporting Layer, an Electron Transport Layer (ETL) located on the emitting material layer and a Cathode located on the Electron Injection Layer. For promoting the efficiency, the emitting material layer is generally applied with co-host system. At present, the manufacture method of the OLED is forming film on the ITO anode layer with organic material by vacuum deposition. Then, the metal cathode is deposited thereon by vapor deposition or sputter.

OLED full color display is a major developing trend of OLED skill. The proposed OLED full color skill now comprises five types of RGB side by side, color conversion, color filter, micro-cavity and multilayer stack. The OLED full color skill utilizing the micro-cavity has merits of high luminescence efficiency, high color purity, applicability of large scale production and etc. By using the effect of micro-cavity, the lights of some specific wavelengths can be enhanced and other lights get weaken.

The characteristics of luminescence of the micro-cavity is decided by the optical length thereof and related with material thicknesses of each layers. Most of the present micro-cavities are flat firm structure. The luminous intensity and the color have strong directionalities and make against the achievement of wide view angle display.

SUMMARY OF THE INVENTION

An objective of the present invention is to provide an OLED structure capable of realizing full color and wide view angle display.

Another objective of the present invention is to provide a manufacture method of an OLED structure. The method is simple for achievement. The OLED structure manufactured by the method is capable of performing full color and wide view angle display. Meanwhile, the method can simplify the manufacture skill to beneficially promote the large scale OLED production line.

For realizing the aforesaid objective, the present invention provides an OLED structure, comprising: a substrate, an over coat layer on the substrate and a micro-cavity on the over coat layer; an upper surface of the over coat layer away from the substrate appears a wavy fluctuation having raised peaks and depressed troughs smoothly joined with the raised peaks, and the micro-cavity appears a wavy fluctuation in accordance with the upper surface of the over coat layer to eliminate directionality issues of luminous intensity and color for realizing wide view angle display.

The micro-cavity comprises an emitting layer on the upper surface, a buffer layer on the emitting layer, an electrode layer on the buffer layer, a white light organic layer on the electrode layer, a transflective layer on the white light organic layer, and all of the emitting layer, the buffer layer, the electrode layer, the white light organic layer and the transflective layer appear wavy fluctuations in accordance with the upper surface of the over coat layer to eliminate the directionality issues of luminous intensity and color for realizing the wide view angle display.

The buffer layer has various thicknesses corresponding to sub pixels of different colors, R, G, B to adjust cavity lengths of the micro-cavity for realizing full color display; a material of the emitting layer is Ag; a material of the buffer layer is SiNx; a material of the electrode layer is ITO; a material of the transflective layer is MgAg.

A distance between highest points of the two adjacent peaks is 8 µm, and a distance between a highest point of the peak and a lowest point of the trough is 1.6~1.8 µm.

A refractive index of the buffer layer is equal to a refractive index of the electrode layer.

Cavity lengths of the micro-cavity corresponding to sub pixels of different colors, R, G, B are integral multiples of half wavelengths of red light, green light and blue light respectively.

The white light organic layer comprises a white light Hole Injection Layer, a white light Hole Transporting Layer, a white light emissive layer, a white light Electron Transport Layer, a white light Electron Injection Layer.

The present invention further provides an OLED structure, comprising: a substrate, an over coat layer on the substrate and a micro-cavity on the over coat layer; an upper surface of the over coat layer away from the substrate appears a wavy fluctuation having raised peaks and depressed troughs smoothly joined with the raised peaks, and the micro-cavity appears a wavy fluctuation in accordance with the upper surface of the over coat layer to eliminate directionality issues of luminous intensity and color for realizing wide view angle display;

the micro-cavity comprises an emitting layer on the upper surface, a buffer layer on the emitting layer, an electrode layer on the buffer layer, a white light organic layer on the electrode layer, a transflective layer on the white light organic layer, and all of the emitting layer, the buffer layer, the electrode layer, the white light organic layer and the transflective layer appear wavy fluctuations in accordance with the upper surface of the over coat layer to eliminate the directionality issues of luminous intensity and color for realizing the wide view angle display;

the buffer layer has various thicknesses corresponding to sub pixels of different colors, R, G, B to adjust cavity lengths of the micro-cavity for realizing full color display; a material of the emitting layer is Ag; a material of the buffer layer is SiNx; a material of the electrode layer is ITO; a material of the transflective layer is MgAg;

a distance between highest points of the two adjacent peaks is 8 µm, and a distance between a highest point of the peak and a lowest point of the trough is 1.6~1.8 µm;

a refractive index of the buffer layer is equal to a refractive index of the electrode layer;

cavity lengths of the micro-cavity corresponding to sub pixels of different colors, R, G, B are integral multiples of half wavelengths of red light, green light and blue light respectively;

the white light organic layer comprises a white light Hole Injection Layer, a white light Hole Transporting Layer, a white light emissive layer, a white light Electron Transport Layer, a white light Electron Injection Layer.

The present invention further provides a manufacture method of an OLED structure, comprising steps of:

step 1, providing a substrate;

step 2, forming an over coat layer and implementing exposure and development to make an upper surface of the over coat layer appearing a wavy fluctuation, and the upper surface has raised peaks and depressed troughs smoothly joined with the raised peaks;

step 3, forming an emitting layer in accordance with a appearance of the upper surface on the upper surface of the over coat layer;

step 4, forming a buffer layer with a certain thickness H1 on the emitting layer, and the thickness H1 is equal to a thickness of the buffer layer required for a cavity length of the micro-cavity corresponding to a R pixel;

step 5, coating photoresist on the buffer layer and implementing exposure and development to form photoresistive patterns, and a photoresistive pattern corresponding to a B pixel is entirely developed, and a photoresistive pattern corresponding to a G pixel is developed as being halftone structured, and a photoresistive pattern corresponding to the R pixel is completely reserved;

step 6, removing the buffer layer corresponding to the B pixel without protection of the photoresistive pattern by dry etching to form the cavity length of the micro-cavity corresponding to the B pixel;

step 7, removing the halftone structured photoresistive pattern corresponding to the G pixel by ashing;

step 8, removing the partial buffer layer corresponding to the G pixel without protection of the photoresistive pattern to make the buffer layer maintaining a certain thickness H2, and the thickness H2 is equal to a thickness of the buffer layer required for a cavity length of the micro-cavity corresponding to the G pixel;

step 9, removing the photoresistive pattern corresponding to the R pixel to expose the buffer layer corresponding to the R pixel;

step 10, forming an electrode layer on the cascaded buffer layer;

step 11, sequentially forming a white light organic layer and a transflective layer on the electrode layer.

In the fourth step, the buffer layer is deposited and formed on the emitting layer by a CVD method; a material of the emitting layer is Ag; a material of the buffer layer is SiNx; a material of the electrode layer is ITO; a material of the transflective layer is MgAg; the white light organic layer comprises a white light Hole Injection Layer, a white light Hole Transporting Layer, a white light emissive layer, a white light Electron Transport Layer, a white light Electron Injection Layer; a refractive index of the buffer layer is equal to a refractive index of the electrode layer.

In the second step, a distance L1 between highest points of the two adjacent peaks is 8 μm, and a distance L2 between a highest point of the peak and a lowest point of the trough is 1.6~1.8 μm; the cavity length of the micro-cavity corresponding to the R pixel, the cavity length of the micro-cavity corresponding to the B pixel, the cavity length of the micro-cavity corresponding to the G pixel respectively are integral multiples of half wavelengths of red light, green light and blue light respectively.

The benefits of the present invention are: in the OLED structure according to the present invention, by forming the over coat layer and respective layers of the micro-cavity to appear wavy fluctuations, the directionality issues of luminous intensity and color can be eliminated to realize wide view angle display; by forming buffer layer with various thicknesses for corresponding to pixels of different colors R, G, B to adjust the cavity lengths of the micro-cavity as integral multiples of half wavelengths of red light, green light and blue light for realizing full color display; in the manufacture method of the OLED structure according to the present invention, a micro-cavity is formed to appear the same wavy fluctuations in accordance with the upper surface of the over coat layer which appears the wavy fluctuation. The cascaded buffer layer is formed to have various thicknesses. Accordingly, the OLED structure made by the manufacture method is capable of realizing full color and wide view angle display. The method is simple for achievement and can simplify the manufacture skill to beneficially promote the large scale OLED production line.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

The technical solution, as well as beneficial advantages, of the present invention will be apparent from the following detailed description of an embodiment of the present invention, with reference to the attached drawings.

Figure 1:
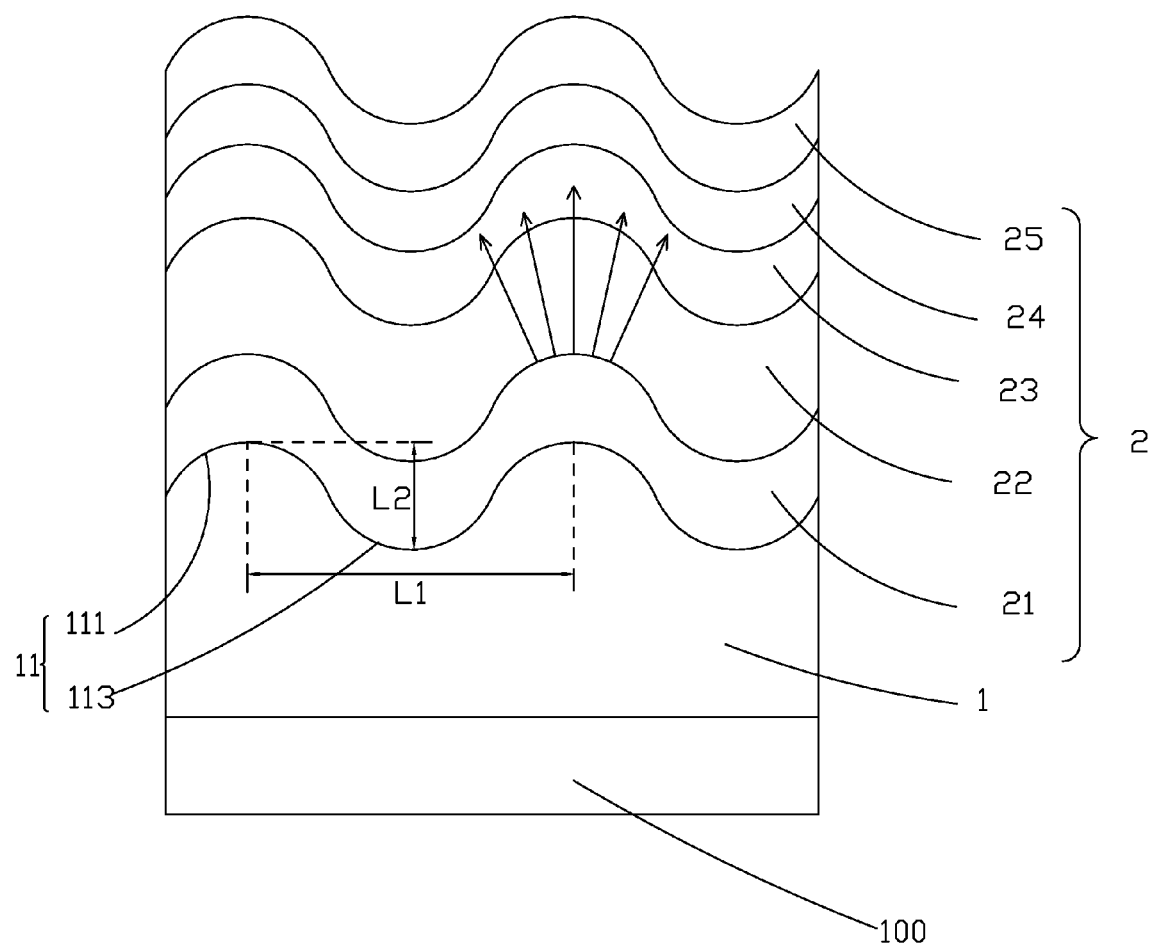
FIG. 1 is a diagram of an OLED structure according to the present invention.
Figure 2:
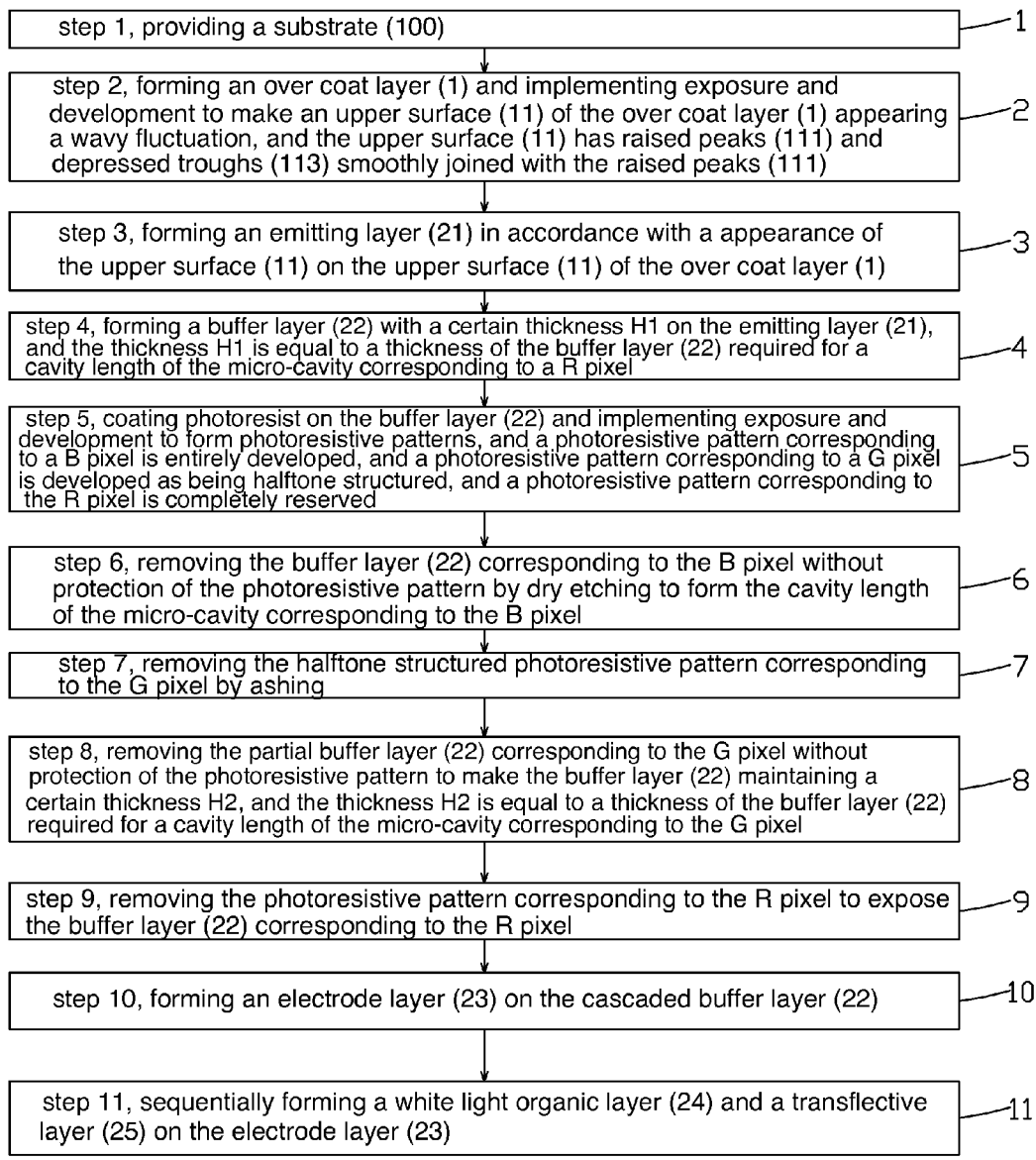
FIG. 2 is a flowchart of a manufacture method of an OLED structure according to the present invention.
Figure 3:
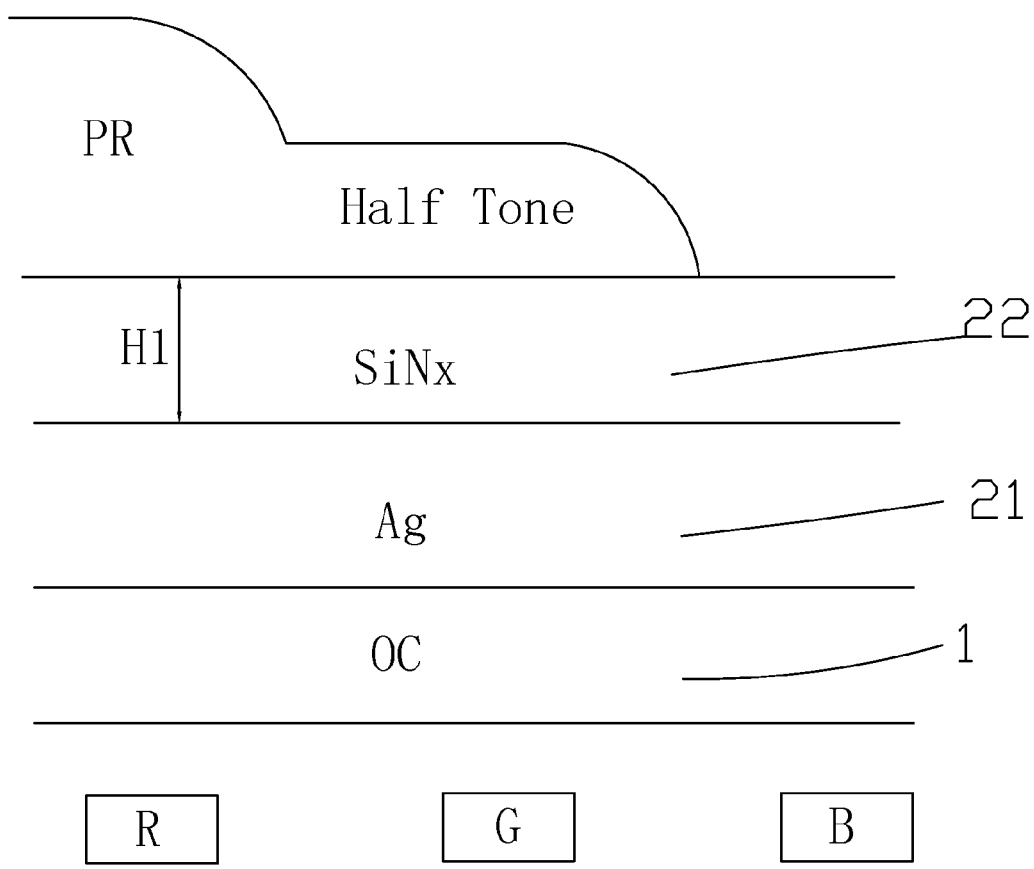
FIG. 3 is an enlarged diagram of the step 5 of the manufacture method of the OLED structure according to the present invention.
Figure 4:
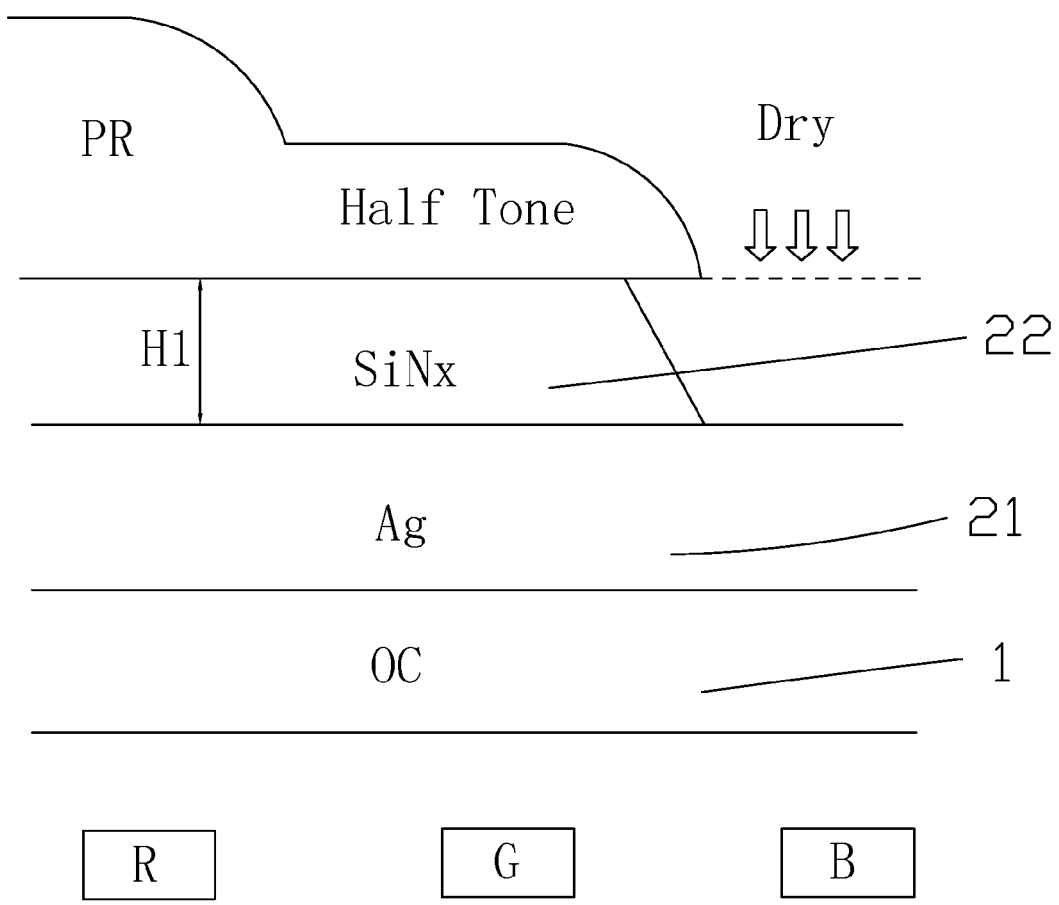
FIG. 4 is an enlarged diagram of the step 6 of the manufacture method of the OLED structure according to the present invention.
Figure 5:
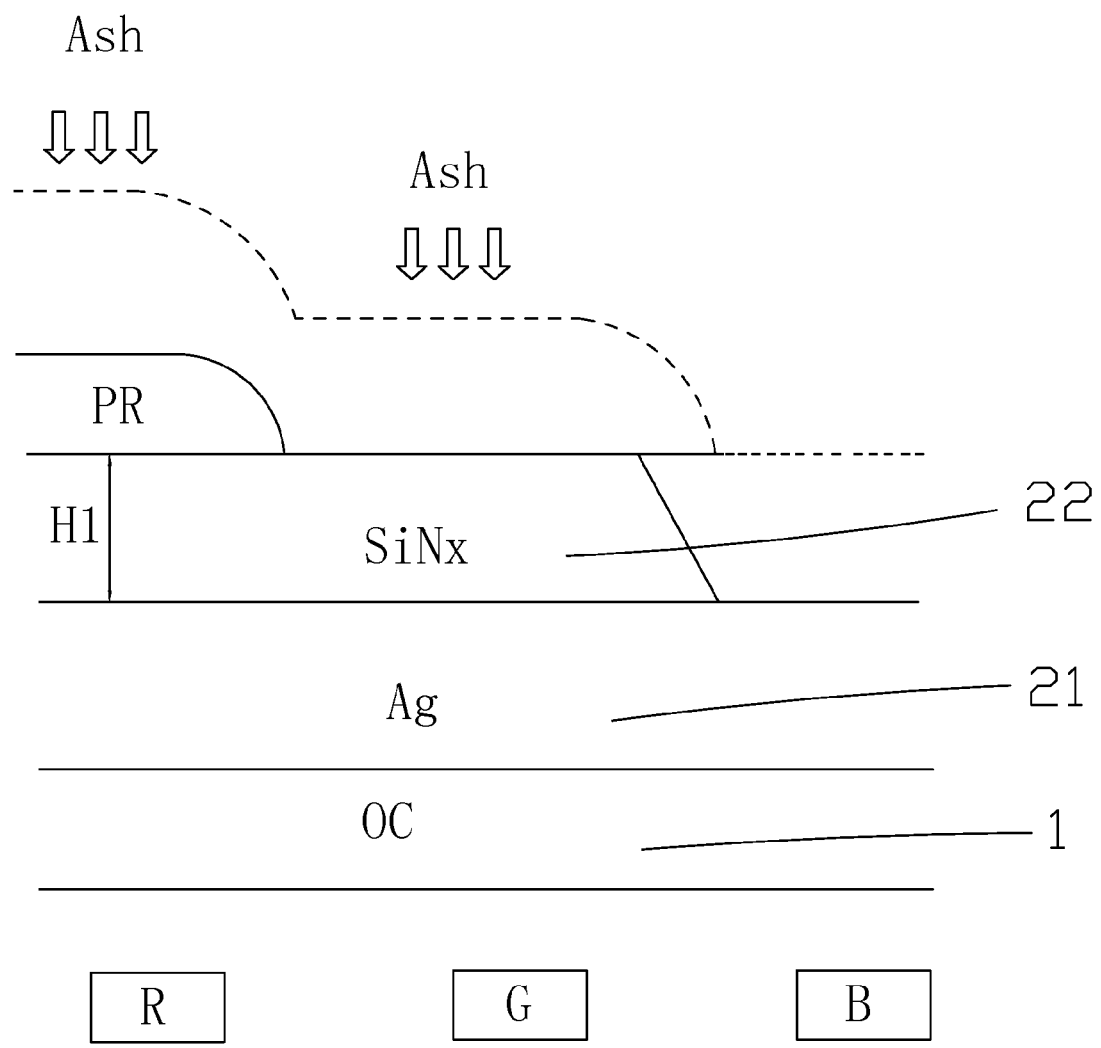
FIG. 5 is an enlarged diagram of the step 7 of the manufacture method of the OLED structure according to the present invention.
Figure 6:
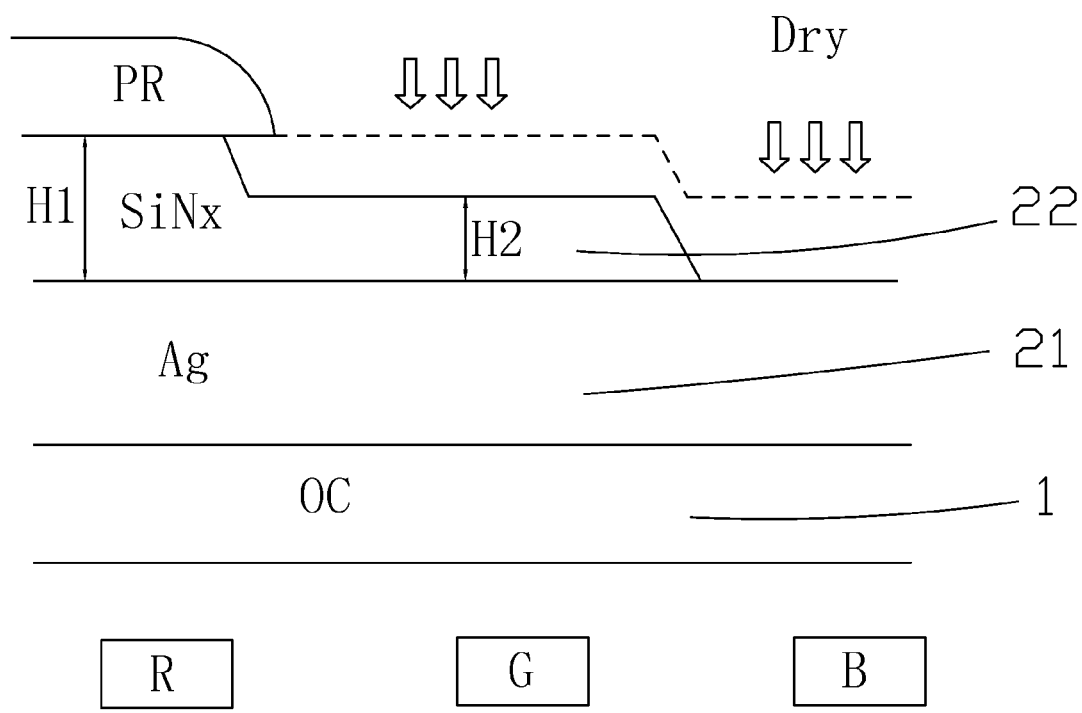
FIG. 6 is an enlarged diagram of the step 8 of the manufacture method of the OLED structure according to the present invention.
Figure 7:
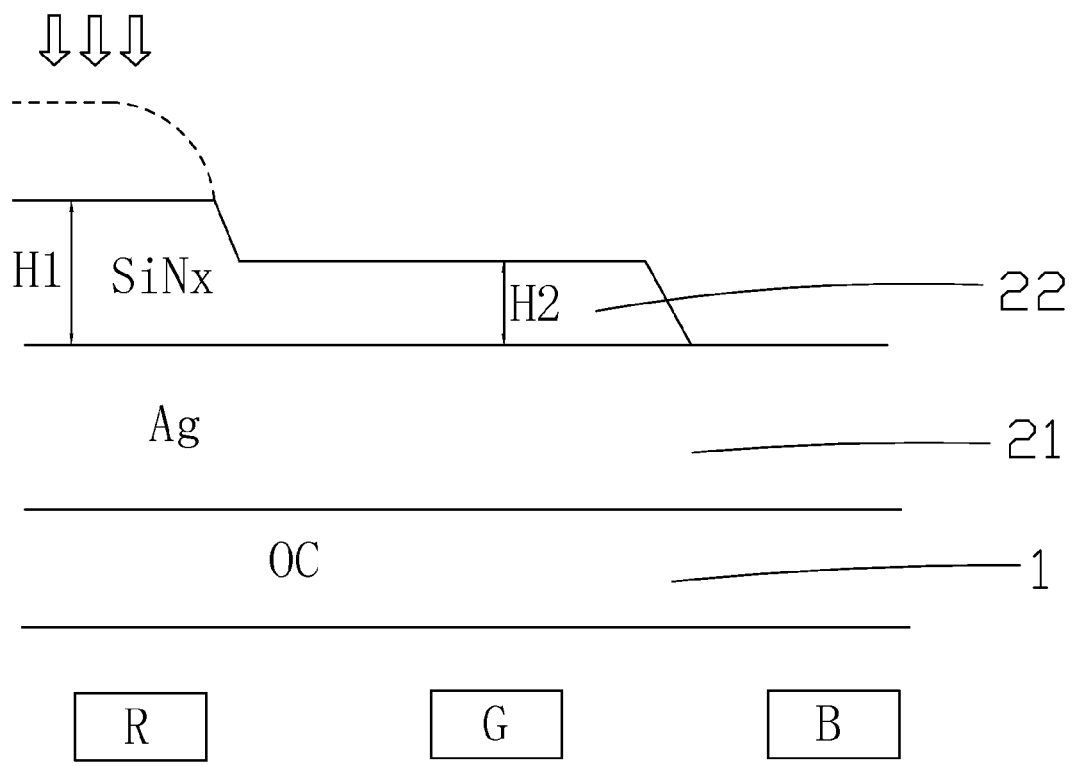
FIG. 7 is an enlarged diagram of the step 9 of the manufacture method of the OLED structure according to the present invention.
Figure 8:
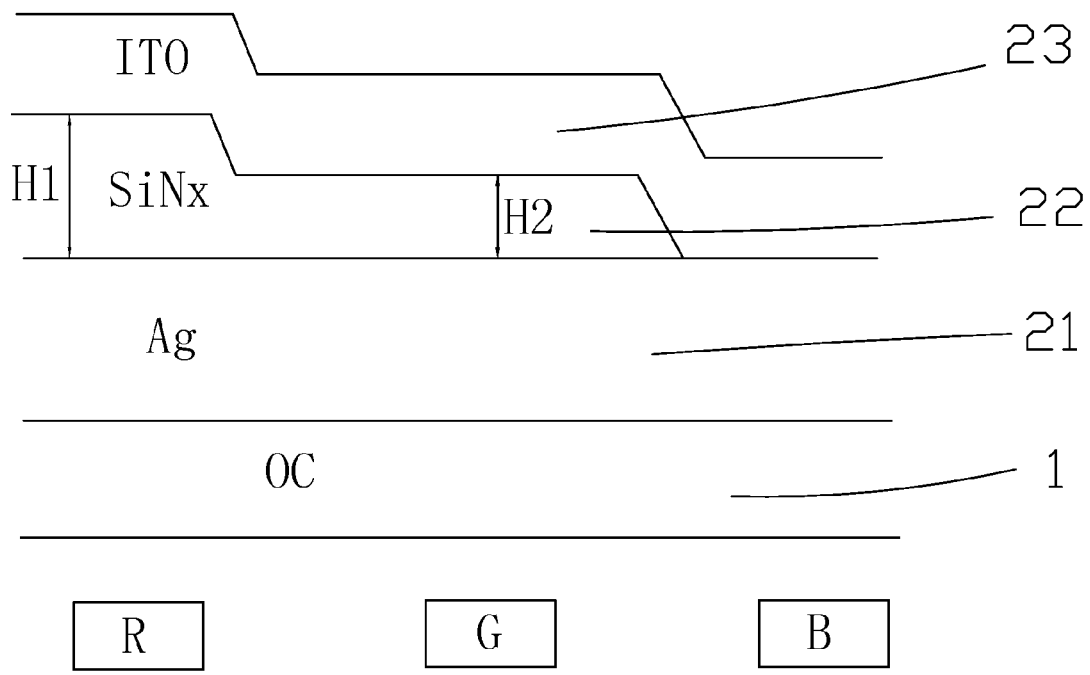
FIG. 8 is an enlarged diagram of the step 10 of the manufacture method of the OLED structure according to the present invention.

Please refer to FIG. 1 in conjunction with FIG. 8. The present invention provides an OLED structure, comprising a substrate 100, an over coat (OC, insulation cover) layer 1 on the substrate 100 and a micro-cavity 2 on the over coat layer 1.

An upper surface 11 of the over coat layer 1 away from the substrate 100 appears a wavy fluctuation having raised peaks 111 and depressed troughs 113 smoothly joined with the raised peaks 111. The micro-cavity 2 comprises an emitting layer 21 on the upper surface 11 of the over coat layer 1, a buffer layer 22 on the emitting layer 21, an electrode layer 23 on the buffer layer 22, a white light organic layer 24 on the electrode layer 23, a transflective layer 25 on the white light organic layer 24. All of the emitting layer 21, the buffer layer 22, the electrode layer 23, the white light organic layer 24 and the transflective layer 25 appear wavy fluctuations in accordance with the upper surface 11 of the over coat layer 1. That is, the micro-cavity 2 appears the same wavy fluctuations in accordance with the upper surface 11 of the over coat layer 1 to make the light emit toward different directions to eliminate the directionality issues of luminous intensity and color for realizing the wide view angle display. The buffer layer 22 has various thicknesses corresponding to pixels of different colors, R, G, B to adjust cavity lengths of the micro-cavity 2. The cavity lengths of the micro-cavity 2 corresponding to the pixels of different colors, R, G, B are integral multiples of half wavelengths of red light, green light and blue light respectively for meeting light wave resonant mode. Accordingly, the red light, the green light and the blue light are respectively enhanced. The pixels of different colors, R, G, B respectively emit the monochromatic lights, the red light, the green light and the blue light for realizing full color display.

Furthermore, a material of the emitting layer 21 is Ag; a material of the buffer layer 22 is SiNx; a material of the electrode layer 23 is ITO; a material of the transflective layer 25 is MgAg.

A distance L1 between highest points of the two adjacent peaks 111 is 8 μm, and a distance L2 between a highest point of the peak 111 and a lowest point of the trough 113 is 1.6~1.8 μm.

A refractive index of the buffer layer 22 is equal to a refractive index of the electrode layer 23 to prevent reflection occurring at the interface of the buffer layer 22 and the electrode layer 23.

The white light organic layer 24 comprises a white light Hole Injection Layer, a white light Hole Transporting Layer, a white light emissive layer, a white light Electron Transport Layer, a white light Electron Injection Layer.

Please refer from FIG. 2 to FIG. 8 in conjunction with FIG. 1. The present invention further provides a manufacture method of the aforesaid OLED structure, comprising steps of:

step 1, providing a substrate 100.

The substrate 100 is a transparent substrate. Preferably, the substrate 100 is a glass substrate.

step 2, forming an over coat layer 1 and implementing exposure and development to make an upper surface 11 of the over coat layer 1 appearing a wavy fluctuation, and the upper surface 11 has raised peaks 111 and depressed troughs 113 smoothly joined with the raised peaks 111.

Specifically, the distance L1 between highest points of the two adjacent peaks is 8 μm, and the distance L2 between a highest point of the peak and a lowest point of the trough is 1.6~1.8 μm.

step 3, forming an emitting layer 21 in accordance with a appearance of the upper surface 11 on the upper surface 11 of the over coat layer 1.

The material of the emitting layer 21 is Ag.

step 4, forming a buffer layer 22 with a certain thickness H1 on the emitting layer 21, and the thickness H1 is equal to a thickness of the buffer layer 22 required for a cavity length of the micro-cavity corresponding to a R pixel.

The material of the buffer layer 22 is SiNx.

The cavity length of the micro-cavity corresponding to the R pixel is an integral multiple of half wavelength of red light for meeting light wave resonant mode. The red light can be enhanced and the lights of other colors can be restrained. Then, the R pixel is capable of emitting the red light.

The buffer layer 22 deposited and formed on the emitting layer 21 by a Chemical Vapor Deposition (CVD) method.

step 5, coating photoresist (PR) on the buffer layer 22 and implementing exposure and development to form photoresistive patterns, and a photoresistive pattern corresponding to a B pixel is entirely developed, and a photoresistive pattern corresponding to a G pixel is developed as being halftone structured, and a photoresistive pattern corresponding to the R pixel is completely reserved.

step 6, removing the buffer layer 22 corresponding to the B pixel without protection of the photoresistive pattern by dry etching to form the cavity length of the micro-cavity corresponding to the B pixel.

The cavity length of the micro-cavity corresponding to the B pixel is an integral multiple of half wavelength of blue light for meeting light wave resonant mode. The blue light can be enhanced and the lights of other colors can be restrained. Then, the B pixel is capable of emitting the blue light.

step 7, removing the halftone structured photoresistive pattern corresponding to the G pixel by ashing.

step 8, removing the partial buffer layer 22 corresponding to the G pixel without protection of the photoresistive pattern to make the buffer layer 22 maintaining a certain thickness H2, and the thickness H2 is equal to a thickness of the buffer layer 22 required for a cavity length of the micro-cavity corresponding to the G pixel.

The cavity length of the micro-cavity corresponding to the G pixel is an integral multiple of half wavelength of green light for meeting light wave resonant mode. The green light can be enhanced and the lights of other colors can be restrained. Then, the G pixel is capable of emitting the green light.

step 9, removing the photoresistive pattern corresponding to the R pixel to expose the buffer layer 22 corresponding to the R pixel.

After the step 9, the buffer layer 22 appears to be cascaded with various thicknesses.

step 10, forming an electrode layer 23 on the cascaded buffer layer 22.

The material of the electrode layer 23 is ITO.

A refractive index of the buffer layer 22 is equal to a refractive index of the electrode layer 23 to prevent reflection occurring at the interface of the buffer layer 22 and the electrode layer 23.

step 11, sequentially forming a white light organic layer 24 and a transflective layer 25 on the electrode layer 23. Then, the manufacture of the micro-cavity 2 and the entire OLED structure is accomplished.

Specifically, the white light organic layer 24 comprises a white light Hole Injection Layer, a white light Hole Transporting Layer, a white light emissive layer, a white light Electron Transport Layer, a white light Electron Injection Layer; a refractive index of the buffer layer is equal to a refractive index of the electrode layer.

The material of the transflective layer 25 is MgAg.

In conclusion, in the OLED structure according to the present invention, by forming the over coat layer and respective layers of the micro-cavity to appear wavy fluctuations, the directionality issues of luminous intensity and color can be eliminated to realize wide view angle display; by forming buffer layer with various thicknesses for corresponding to pixels of different colors R, G, B to adjust the cavity lengths of the micro-cavity as integral multiples of half wavelengths of red light, green light and blue light for realizing full color display; in the manufacture method of the OLED structure according to the present invention, a micro-cavity is formed to appear the same wavy fluctuations in accordance with the upper surface of the over coat layer which appears the wavy fluctuation. The cascaded buffer layer is formed to have various thicknesses. Accordingly, the OLED structure made by the manufacture method is capable of realizing full color and wide view angle display. The method is simple for achievement and can simplify the manufacture skill to beneficially promote the large scale OLED production line.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An OLED structure, comprising: a substrate, an over coat layer on the substrate and a micro-cavity on the over coat layer; wherein an upper surface of the over coat layer away from the substrate appears a wavy fluctuation having raised peaks and depressed troughs smoothly joined with the raised peaks, and the micro-cavity appears a wavy fluctuation in accordance with the upper surface of the over coat layer to eliminate directionality issues of luminous intensity and color for realizing wide view angle display;
    wherein the micro-cavity comprises an emitting layer on the upper surface, a buffer layer on the emitting layer, an electrode layer on the buffer layer, a white light organic layer on the electrode layer, a transflective layer on the white light organic layer, each of the emitting layer, the buffer layer, the electrode layer, the white light organic layer, and the transflective layer showing a wavy fluctuation comprising raised peaks and depressed troughs substantially and respectively corresponding to the raised peaks and the depressed troughs of the upper surface of the over coat layer to eliminate the directionality issues of luminous intensity and color for realizing the wide view angle display.

2. The OLED structure according to claim 1, wherein the buffer layer has various thicknesses corresponding to sub pixels of different colors, R, G, B to adjust cavity lengths of the micro-cavity for realizing full color display; a material of the emitting layer is Ag; a material of the buffer layer is SiNx; a material of the electrode layer is ITO; a material of the transflective layer is MgAg.

3. The OLED structure according to claim 1, wherein a distance between highest points of the two adjacent peaks is 8 μm, and a distance between a highest point of the peak and a lowest point of the trough is 1.6-1.8 μm.

4. The OLED structure according to claim 1, wherein a refractive index of the buffer layer is equal to a refractive index of the electrode layer.

5. The OLED structure according to claim 1, wherein cavity lengths of the micro-cavity corresponding to sub pixels of different colors, R, G, B are integral multiples of half wavelengths of red light, green light and blue light respectively.

6. The OLED structure according to claim 1, wherein a white light organic layer comprises a white light Hole Injection Layer, a white light Hole Transporting Layer, a white light emissive layer, a white light Electron Transport Layer, a white light Electron Injection Layer.

7. An OLED structure, comprising: a substrate, an over coat layer on the substrate and a micro-cavity on the over coat layer; wherein an upper surface of the over coat layer away from the substrate appears a wavy fluctuation having raised peaks and depressed troughs smoothly joined with the raised peaks, and the micro-cavity appears a wavy fluctuation in accordance with the upper surface of the over coat layer to eliminate directionality issues of luminous intensity and color for realizing wide view angle display;
    wherein the micro-cavity comprises an emitting layer on the upper surface, a buffer layer on the emitting layer, an electrode layer on the buffer layer, a white light organic layer on the electrode layer, a transflective layer on the white light organic layer, each of the emitting layer, the buffer layer, the electrode layer, the white light organic layer, and the transflective layer showing a wavy fluctuation comprising raised peaks and depressed troughs substantially and respectively corresponding to the raised peaks and the depressed troughs of the upper surface of the over coat layer to eliminate the directionality issues of luminous intensity and color for realizing the wide view angle display;
    wherein the buffer layer has various thicknesses corresponding to sub pixels of different colors, R, G, B to adjust cavity lengths of the micro-cavity for realizing full color display; a material of the emitting layer is Ag; a material of the buffer layer is SiNx; a material of the electrode layer is ITO; a material of the transflective layer is MgAg;
    wherein a distance between highest points of the two adjacent peaks is 8 μm, and a distance between a highest point of the peak and a lowest point of the trough is 1.6-1.8 μm;
    wherein a refractive index of the buffer layer is equal to a refractive index of the electrode layer;
    wherein cavity lengths of the micro-cavity corresponding to sub pixels of different colors, R, G, B are integral multiples of half wavelengths of red light, green light and blue light respectively;
    wherein a white light organic layer comprises a white light Hole Injection Layer, a white light Hole Transporting Layer, a white light emissive layer, a white light Electron Transport Layer, a white light Electron Injection Layer.

* * * * *